(12) United States Patent
Park

(10) Patent No.: US 6,833,741 B2
(45) Date of Patent: Dec. 21, 2004

(54) CIRCUIT FOR CONTROLLING AN INITIALIZING CIRCUIT IN A SEMICONDUCTOR DEVICE

(75) Inventor: Nak Kyu Park, Kyungki-Do (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/327,797

(22) Filed: Dec. 23, 2002

(65) Prior Publication Data

US 2004/0008061 A1 Jan. 15, 2004

(30) Foreign Application Priority Data

Jul. 9, 2002 (KR) .................................. 10-2002-0039724

(51) Int. Cl.[7] .............................................. H03K 17/22
(52) U.S. Cl. ...................................... 327/143; 327/198
(58) Field of Search ................................ 327/143, 198, 327/142

(56) References Cited

U.S. PATENT DOCUMENTS

| | | | | |
|---|---|---|---|---|
| 4,900,950 A | * | 2/1990 | Dubujet ...................... 327/143 |
| 5,378,936 A | * | 1/1995 | Kokubo et al. ................ 327/77 |
| 5,414,378 A | * | 5/1995 | Edgar et al. ................. 327/143 |
| 5,438,550 A | * | 8/1995 | Kim ......................... 365/233.5 |
| 5,477,176 A | * | 12/1995 | Chang et al. ................ 327/143 |
| 5,731,720 A | * | 3/1998 | Suzuki et al. ................ 327/777 |
| 5,737,612 A | * | 4/1998 | Ansel et al. ................. 713/300 |
| 5,929,675 A | * | 7/1999 | Lee ............................ 327/143 |
| 5,990,730 A | * | 11/1999 | Shinozaki .................... 327/544 |
| 6,304,114 B1 | * | 10/2001 | Hirakawa .................... 327/143 |
| 2003/0179023 A1 | * | 9/2003 | Ishikawa .................... 327/143 |

* cited by examiner

Primary Examiner—Terry D. Cunningham
(74) Attorney, Agent, or Firm—Marshall, Gerstein & Borun LLP

(57) ABSTRACT

A circuit for controlling an initializing circuit in a semiconductor device is described herein. The circuit comprises a first circuit configured to generate a NOP operation command signal, and a second circuit configured to maintain a power-up signal to a LOW state until the NOP operation starts and to shift the power-up signal to a HIGH state based on the NOP operation command signal.

2 Claims, 5 Drawing Sheets

US 6,833,741 B2

CIRCUIT FOR CONTROLLING AN INITIALIZING CIRCUIT IN A SEMICONDUCTOR DEVICE

TECHNICAL FIELD

The present disclosure relates generally to semiconductor devices, and more particularly, to a circuit for controlling an initializing circuit in a semiconductor device.

BACKGROUND

Generally, in semiconductor devices, all the devices are initialized by a power-up signal generated when the power is on. A timing diagram of an initializing Joint Electron Device Engineering Council (JEDEC) standard sequence is shown in FIG. 1. FIG. 2 is an enlarged view of a circular dotted portion 'A' in FIG. 1. In FIG. 2, slant lines represent don't care regions. In a rectangular dotted region in FIG. 2, even after VDD is increased, only CKE (CLOCK ENBLE) is specified as a LVCMOS LOW level. Other CLK (CLOCK), COMMAND, ADDRESS and Vref are specified as a don't care. That is, the don't care region means that CLK can enter it, Vref may be a LOW level, and any of ADDRESS and COMMAND can enter to the device. In other words, there will be a case where the device erroneously operates because of the don't care region even though VDD is raised in the initial process.

An example of erroneous operation of the device will be examined by reference to FIGS. 3 and 4. FIG. 3 is a circuit diagram of a circuit for receiving a clock enable signal (CKE) including a differential amplifier. This circuit compares the reference voltage (Vref) and the clock enable signal (CKE) to produce an output (net1). It is not a problem when a NMOS transistor is down when the reference voltage (Vref) is higher than the threshold voltage of the NMOS transistor. However, if the reference voltage (Vref) is lower than the threshold voltage of the NMOS transistor, a case where the potential operation within the NMOS transistor could not be expected because CLK, COMMAND and ADDRESS are in the don't care condition.

In particular, a read operation and an erroneous mode register (MRS) setting are most concerned. An erroneous read operation command not only causes an erroneous read operation but also outputs a data output (DQ) and a data clock (DQS), which results in unnecessary power being consumed.

As shown in FIG. 4, if MRS setting was wrong and all of CAS latency (CL2 through CL4) became LOW states, the output (net1) is floated. In this state, if the output (outen) of the inverter becomes a HIGH state depending on a state of surrounding lines, unwanted and/or unnecessary read operation, etc. is performed that consumes power.

SUMMARY OF THE DISCLOSURE

A circuit for controlling an initializing circuit is described. The circuit may prevent power consumption because of unnecessary operation, in which a power-up signal that gives an initial value at an initial state is kept at a LOW state until a first NOP operation, and the power-up signal is then performed after CLK, COMMAND, ADDRESS and Vref are internally normally set.

The circuit for controlling an initializing circuit comprises a first circuit configured to generate a NOP operation command signal, and a second circuit configured to maintain a power-up signal to a LOW state until the NOP operation starts and to shift the power-up signal to a HIGH state depending on the NOP operation command signal.

The first circuit comprises a PMOS transistor connected between the power supply and a first node and responsive to a write enable signal, a first NMOS transistor connected to the first node and responsive to a row address strobe signal, a second NMOS transistor connected to the first NMOS transistor and responsive to a column address strobe signal, a third NMOS transistor connected to the second NMOS transistor and responsive to the write enable signal, a fourth NMOS transistor connected between the third NMOS transistor and the ground, an inverter configured to invert the potential of the first node, and a second PMOS transistor in parallel connected to the first PMOS transistor and responsive to an output of the inverter.

The second circuit comprises a NAND gate having first and second input terminals, wherein the power-up signal is inputted to the first input terminal. The second circuit also comprises a transmission gate configured to transfer the power-up signal to the second terminal of the NAND gate depending on the NOP operation command signal, a first inverter configured to invert an output of a NAND gate, and a second inverter configured to invert the output of the NAND gate to supply the inverted output to the second input terminal of the NAND gate.

BRIEF DESCRIPTION OF THE DRAWINGS

This disclosure will be described in terms of several embodiments to illustrate its broad teachings. Reference is also made to the attached drawings.

DETAILED DESCRIPTION

Figure 1:
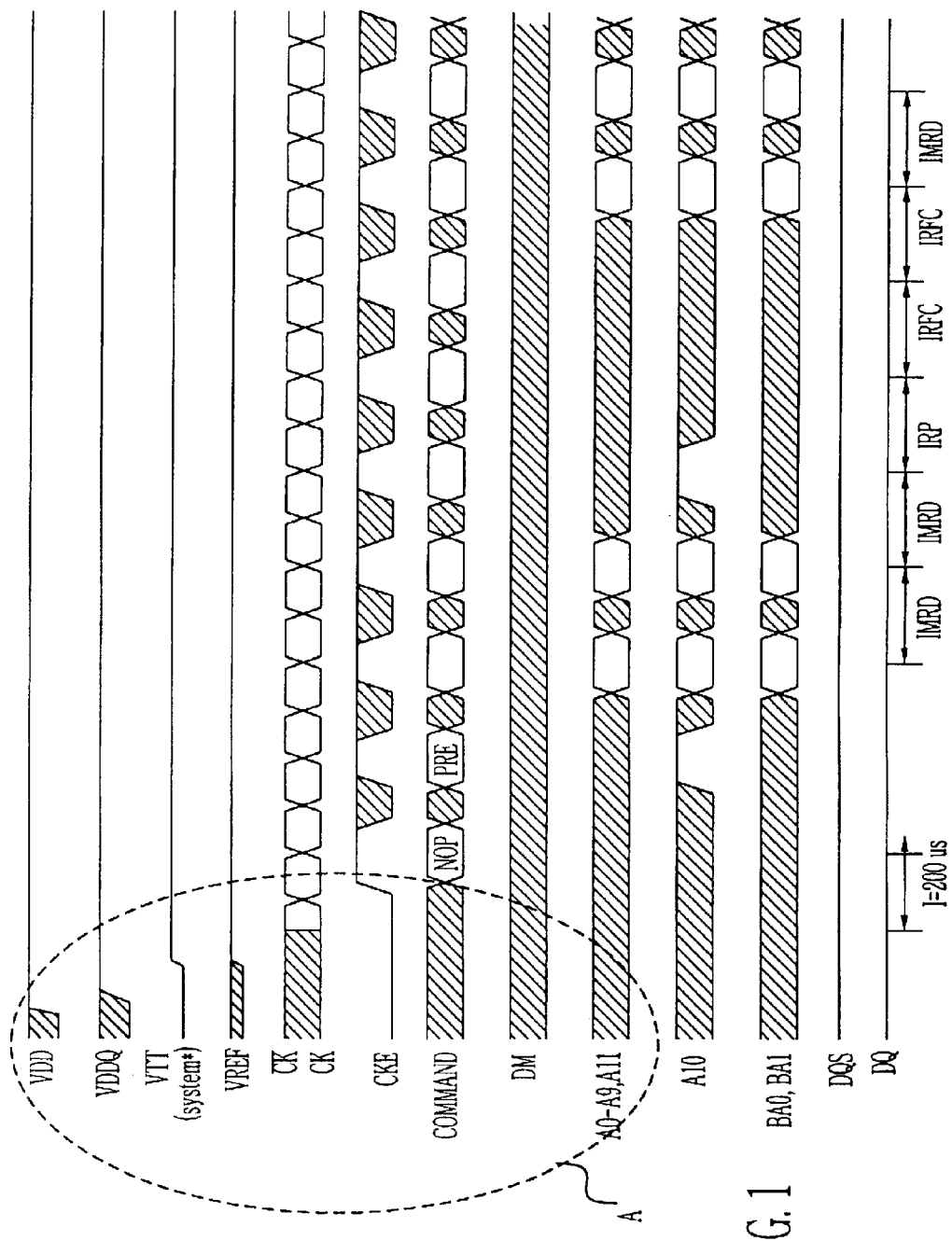
FIG. 1 is a timing diagram of a JEDEC standard sequence.
Figure 2:
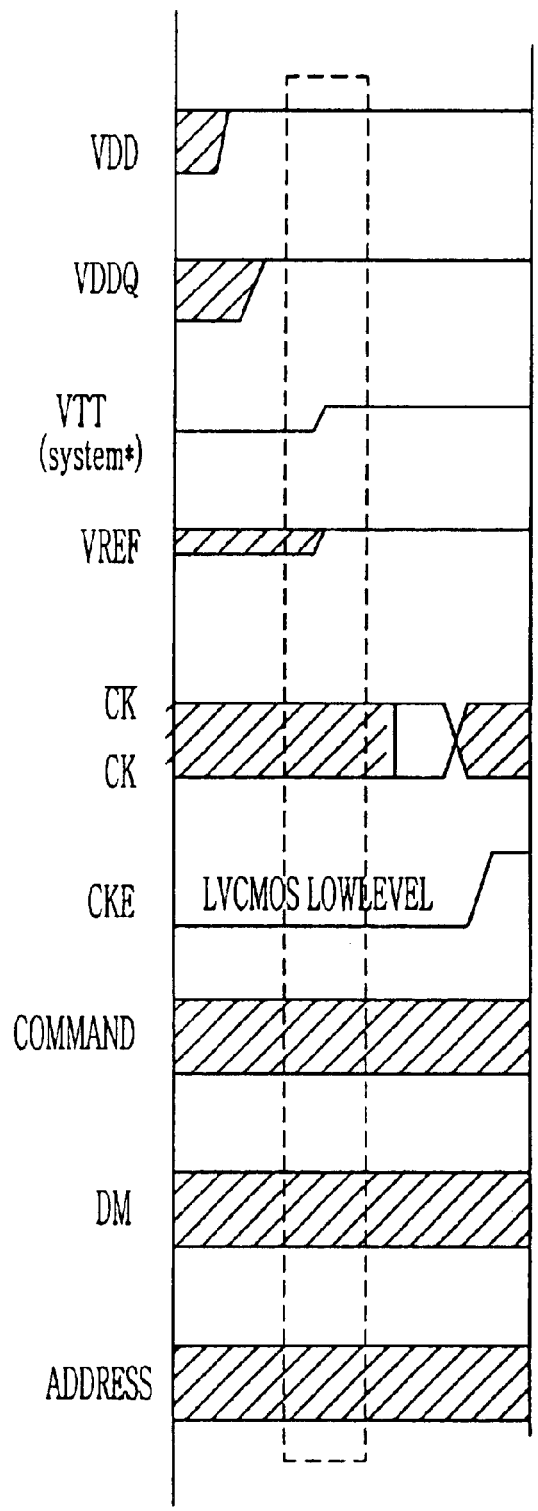
FIG. 2 is an enlarged view of a dotted portion in FIG. 1.
Figure 3:
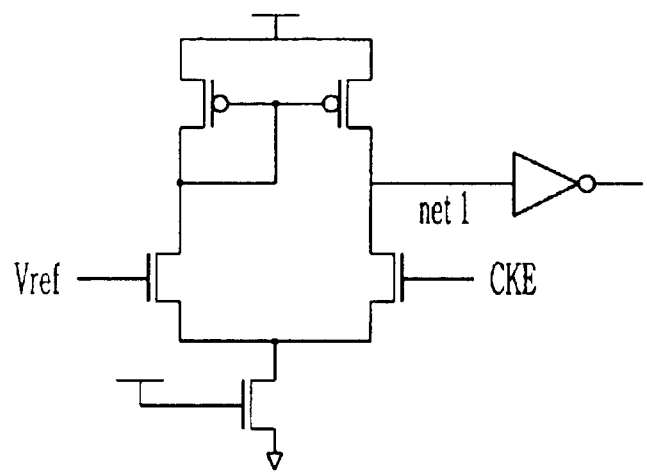
FIG. 3 is a detailed construction of a clock enable signal receiving unit.
Figure 4:
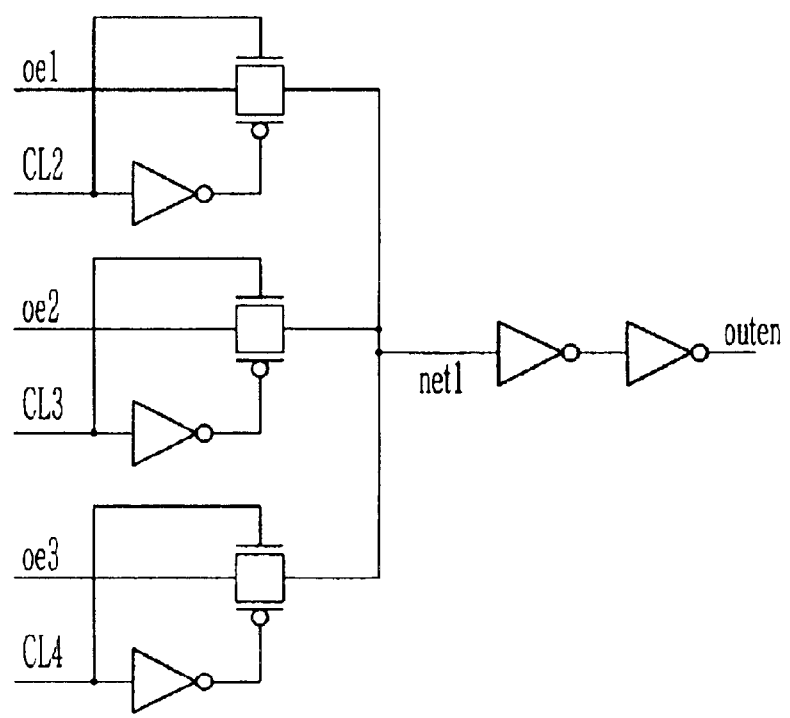
FIG. 4 is a circuit diagram of a clock enable signal receiving unit that may cause an erroneous operation by a wrong mode register setting.

The present disclosure will be described in detail by way of a preferred embodiment with reference to accompanying drawings, in which like reference numerals are used to identify the same or similar parts.

Figure 6:
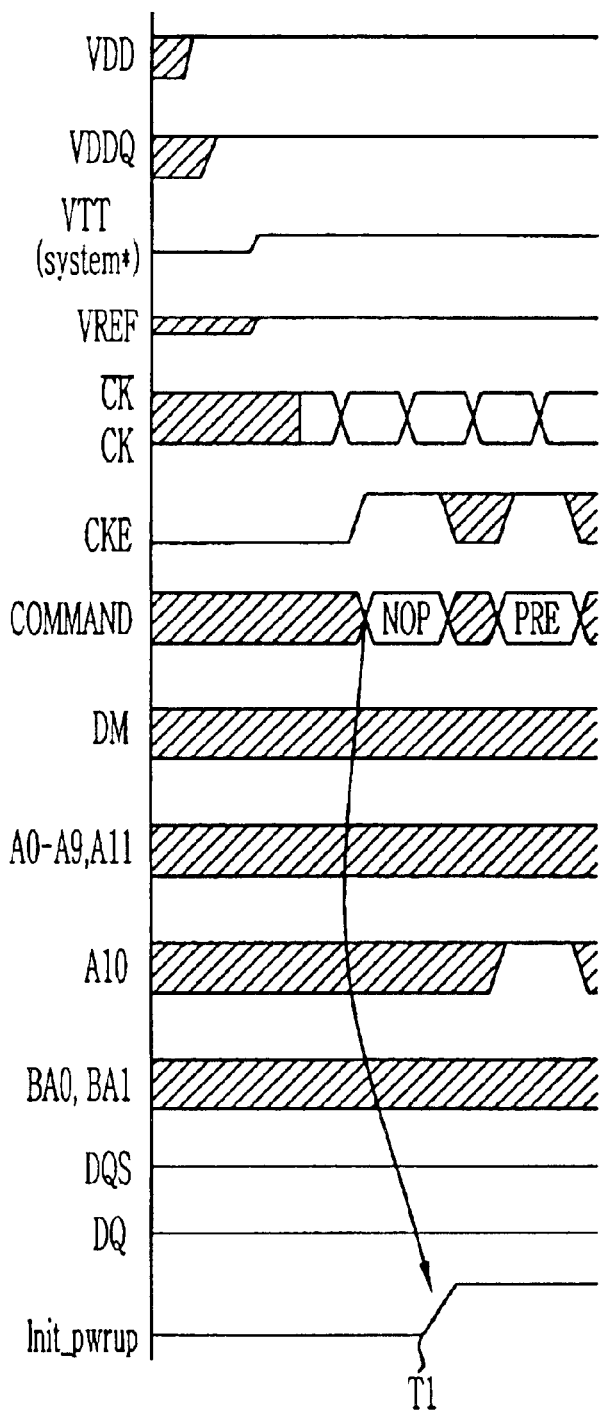
FIG. 6 is a timing diagram illustrating operation of the circuit for controlling an initializing circuit.

Referring to FIG. 6, the operation of the disclosed circuit for controlling an initializing circuit is based on entry of COMMAND and ADDRESS in the don't care condition is prevented until there is a NOP operation, and an initial state is then released after the internal setting is normally completed. If the power is stabilized, the power-up signal (pwrup: not shown) shifts to a HIGH state. At this time, the power-up signal may be shifted to a wrong level after it is shifted to a HIGH state even though the internal circuit initially stably keeps the internal signals with the power-up signal because a state that CLK, COMMAND and ADDRESS do not know the power-up signal (pwrup) even after the power-up signal (pwrup) is changed to the HIGH state is kept. To prevent this, a NOP operation is performed before the normal operation is performed in the initial sequence. The NOP operation does not internally generate any operations. COMMAND, ADDRESS, Vref and CLK are normally set before the NOP operation command is performed. If the power-up signal is kept LOW until the NOP operation starts (i.e., T1 period), it is possible to prevent the power-up signal from shifting to a state where an erroneous state is prohibited to enter internally. In other words, it is possible to prevent the device in a reset state from shifting to an unclear state.

Figure 5:
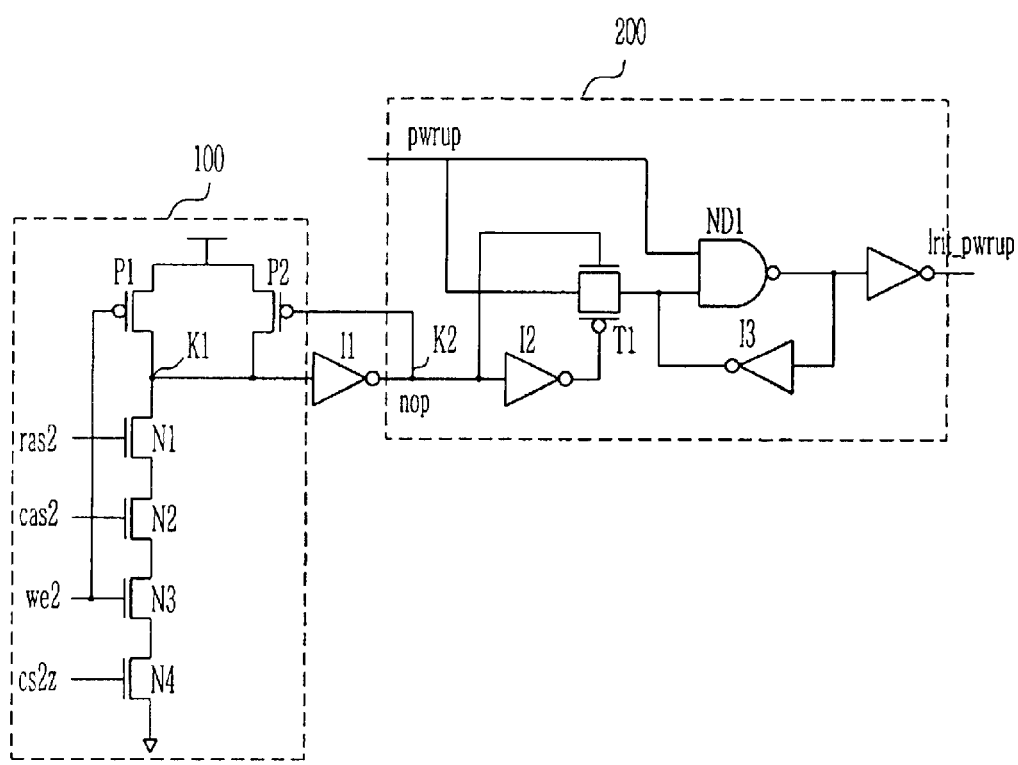
FIG. 5 is a circuit diagram of a circuit for controlling an initializing circuit in a semiconductor memory device.

FIG. 5 is a circuit diagram of a circuit for controlling an initializing circuit in a semiconductor memory device. A reference numeral 100 denotes a command combining circuit for performing the NOP operation. A reference numeral 200 denotes a circuit that outputs a power-up signal (pwrup) of a LOW state as an initial state and switches the power-up signal to a HIGH state if a NOP operation command (nop) enters while latching the power-up signal until the NOP operation command (nop) enters. That is, the power-up signal (pwrup) is switched to the initial power-up signal (Init-pwrup) as shown in FIGS. 5 and 6. The initial power-up signal (Init-pwrup) is connected to portions relating the MRS setting region and the read operation for which an erroneous operation is concerned to maintain the initial state.

The command combining circuit 100 includes NMOS transistor N1 that is turned on by a row address strobe signal (ras2), a NMOS transistor N2 that is driven by a column address strobe signal (cas2), a NMOS transistor N3 that is driven by a write enable signal (we2), and a NMOS transistor N4 that is drive by a chip select signal (cs2). The NMOS transistors N1, N2, N3, and N4 are serially connected between a node K1 and the ground. A PMOS transistor P1 driven by the write enable signal (we2) is connected between the supply power and the node N1. An inverter I1 is connected between the node K1 and a node K2. A PMOS transistor P2 driven by an output of the inverter I1 is connected in parallel to a PMOS transistor P1.

If each of the row address strobe signal (ras2), the column address strobe signal (cas2), the write enable signal (we2) and the chip select signal (cs2) is a HIGH state, the output (nop) of the inverter I1 becomes a HIGH state because all of the NMOS transistors N1, N2, N3, and N4 are turned on. If the write enable signal (we2) is shifted to a LOW state, the output of the inverter I1 becomes a LOW state because the PMOS transistor P1 is turned on. When the NOP operation starts, the output of the inverter I1 is switched to a HIGH state.

As the power-up signal is initially at a LOW state, the output of the NAND gate ND1 in the circuit 200 for generating the initial power-up signal becomes a HIGH state and the initial power-up signal (init-pwrup) becomes a LOW state. As the output of the NAND gate ND1 is inputted to one terminal of the NAND gate ND1 through the inverter 13, the output of the NAND gate is kept at a HIGH state. Therefore, the initial power-up signal (init-pwrup) is kept at a LOW state until the NOP operation is performed.

If the power-up signal (pwrup) is shifted to a HIGH state and the NOP operation then starts, the output of the inverter I1 is shifted to a LOW state so that a transmission gate T1 is turned on. Accordingly, the initial power-up signal (init-pwrup) is shifted to a HIGH state. As a result, the circuits 100 and 200 can reduce consumption of the power due to erroneous operations of the device upon the power up.

Many changes and modifications to the embodiments described herein could be made. The scope of some changes is discussed above. The scope of others will become apparent from the appended claims.

What is claimed is:

1. A circuit for controlling an initializing circuit in a semiconductor memory device comprising:

a first circuit to generate a NOP operation command signal in response to a write enable signal for the memory device, a row address strobe signal for the memory device, a column address strobe signal for the memory device and a chip select signal, wherein the first circuit comprises:

a PMOS transistor connected between the power supply and a first node, the PMOS transistor being responsive to the write enable signal;

a first NMOS transistor connected to the first node, the first NMOS transistor being responsive to the row address strobe signal;

a second NMOS transistor connected to the first NMOS transistor, the second NMOS transistor being responsive to the column address strobe signal;

a third NMOS transistor connected to the second NMOS transistor, the third NMOS transistor being responsive to the write enable signal;

a fourth NMOS transistor connected between the third NMOS transistor and the ground, the fourth NMOS transistor being responsive to the chip select signal;

an inverter configured to invert the potential of the first node; and a second PMOS transistor connected in parallel to the first PMOS transistor, the second PMOS transistor being responsive to an output of the inverter; and a second circuit to generate an initial power-up signal having a LOW state when a power-up signal is at a LOW state and to generate the initial power-up signal having a HIGH state based on the NOP operation command signal.

2. A circuit for controlling an initializing circuit in a semiconductor memory device comprising:

a first circuit to generate a NOP operation command signal in response to a write enable signal for the memory device, a row address strobe signal for the memory device, a column address strobe signal for the memory device and a chip select signal; and a second circuit to generate an initial power-up signal having a LOW state when a power-up signal is at a LOW state and to generate the initial power-up signal having a HIGH state based on the NOP operation command signal, wherein the second circuit comprises:

a NAND gate having first and second input terminals, wherein the power-up signal is inputted to the first input terminal;

a transmission gate to transfer the power-up signal to the second terminal of the NAND gate based on the NOP operation command signal;

a first inverter to invert an output of the NAND gate, thereby the initial power-up signal having the LOW state or the HIGH state; and a second inverter to invert the output of the NAND gate to supply the inverted output to the second input terminal of the NAND gate.

* * * * *